(12) United States Patent
Arcedera et al.

(10) Patent No.: US 7,999,371 B1
(45) Date of Patent: Aug. 16, 2011

(54) HEAT SPREADER PACKAGE AND METHOD

(75) Inventors: Adrian Arcedera, Chandler, AZ (US);
Sasanka Laxmi Narasimha Kanuparthi, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 12/702,505

(22) Filed: Feb. 9, 2010

(51) Int. Cl.
*H01L 23/34* (2006.01)
(52) U.S. Cl. .................... 257/706; 257/E21.506
(58) Field of Classification Search ......... 257/706–712, 257/E21.506
See application file for complete search history.

(56) References Cited

U.S. PATENT DOCUMENTS

| | | | |
|---|---|---|---|
| 5,736,785 A | 4/1998 | Chiang et al. | |
| 5,877,552 A | 3/1999 | Chiang | |
| 5,977,626 A | 11/1999 | Wang et al. | |
| 6,081,027 A * | 6/2000 | Akram | 257/707 |
| 6,191,360 B1 | 2/2001 | Tao et al. | |
| 6,236,568 B1 | 5/2001 | Lai et al. | |
| 6,265,771 B1 * | 7/2001 | Ference et al. | 257/706 |
| 6,323,066 B2 | 11/2001 | Lai et al. | |
| 6,429,512 B1 | 8/2002 | Huang et al. | |
| 6,437,437 B1 | 8/2002 | Zuo et al. | |
| 6,458,626 B1 | 10/2002 | Huang et al. | |
| 6,507,104 B2 | 1/2003 | Ho et al. | |
| 6,525,420 B2 | 2/2003 | Zuo et al. | |
| 6,528,876 B2 | 3/2003 | Huang | |
| 6,599,799 B2 | 7/2003 | Tang et al. | |
| 6,602,737 B2 | 8/2003 | Wu | |
| 6,706,563 B2 | 3/2004 | Shim et al. | |
| 6,713,321 B2 | 3/2004 | Huang et al. | |
| 7,485,490 B2 | 2/2009 | Oh et al. | |
| 7,633,144 B1 | 12/2009 | Kim et al. | |
| 7,675,180 B1 | 3/2010 | St. Amand et al. | |
| 7,755,184 B2 * | 7/2010 | Macris et al. | 257/706 |
| 7,776,648 B2 * | 8/2010 | Chua et al. | 438/106 |
| 7,787,252 B2 * | 8/2010 | Mertol | 361/719 |
| 2002/0158333 A1 * | 10/2002 | Teshima | 257/718 |
| 2003/0011064 A1 * | 1/2003 | Combs et al. | 257/706 |
| 2005/0077617 A1 * | 4/2005 | Hirano et al. | 257/712 |
| 2007/0138625 A1 * | 6/2007 | Seo | 257/706 |
| 2009/0001561 A1 * | 1/2009 | Chua et al. | 257/717 |

OTHER PUBLICATIONS

Oh et al., "A Stacked Semiconductor Package Having an Insulator to Prevent Shorting of Wirebonds", U.S. Appl. No. 10/015,374, filed Dec. 12, 2001.
St. Amand et al., "Stacked Electronic Component Package Having Single-Sided Film Spacer", U.S. Appl. No. 11/356,919, filed Feb. 17, 2006.
Oh et al., "Adhesive on Wire Stacked Semiconductor Package", U.S. Appl. No. 12/317,649, filed Dec. 23, 2008.
Kim et al., "Method of Making Semiconductor Package with Adhering Portion", U.S. Appl. No. 12/589,868, filed Oct. 28, 2009.
St. Amand et al., "Stacked Electronic Component Package Having Film-on-Wire Spacer", U.S. Appl. No. 12/657,425, filed Jan. 20, 2010.

* cited by examiner

*Primary Examiner* — Nathan W Ha
(74) *Attorney, Agent, or Firm* — Gunnison, Mckay & Hodgson, L.L.P.; Serge J. Hodgson

(57) ABSTRACT

A heat spreader package includes a substrate having a first surface, first traces on the first surface of the substrate, and an electronic component having an inactive surface mounted to the first surface of the substrate. The electronic component further includes an active surface having bond pads. Bond wires electrically connect the bond pads to the first traces. An inverted pyramid heat spreader includes a first heatsink, a first heatsink adhesive directly connecting the first heatsink to the active surface of the electronic component inward of the bond pads, a second heatsink having an absence of active circuitry, and a second heatsink adhesive directly connecting a first surface of the second heatsink to the first heatsink. The second heatsink adhesive is a dielectric directly between the bond wires and the second heatsink that prevents inadvertent shorting between the bond wires and the second heatsink.

20 Claims, 3 Drawing Sheets

HEAT SPREADER PACKAGE AND METHOD

BACKGROUND OF THE INVENTION

1. Field of the Invention

The present application relates to the field of electronics, and more particularly, to methods of forming electronic component packages and related structures.

2. Description of the Related Art

An electronic component package includes an electronic component. During operation, the electronic component generates heat. To prevent overheating of the electronic component, a heat spreader is included in the electronic component package. Heat generated by the electronic component is dissipated to the heat spreader thus avoiding overheating of the electronic component.

Often, the heat spreader is made of an electrically conductive material that also has a high thermal conductivity. As the dimensions of the electronic component package become extremely small, inadvertent contact between the heat spreader and electrically conductive structures, e.g., bond wires, of the electronic component package can occur. This inadvertent contact with the heat spreader causes shorting and the associated failure of the electronic component package.

SUMMARY OF THE INVENTION

A heat spreader package includes a substrate having a first surface, first traces on the first surface of the substrate, and an electronic component having an inactive surface mounted to the first surface of the substrate. The electronic component further includes an active surface having bond pads. Bond wires electrically connect the bond pads to the first traces. An inverted pyramid heat spreader includes a first heatsink, a first heatsink adhesive directly connecting the first heatsink to the active surface of the electronic component inward of the bond pads, a second heatsink having an absence of active circuitry, and a second heatsink adhesive directly connecting a first surface of the second heatsink to the first heatsink. The second heatsink adhesive is a dielectric directly between the bond wires and the second heatsink that prevents inadvertent shorting between the bond wires and the second heatsink.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
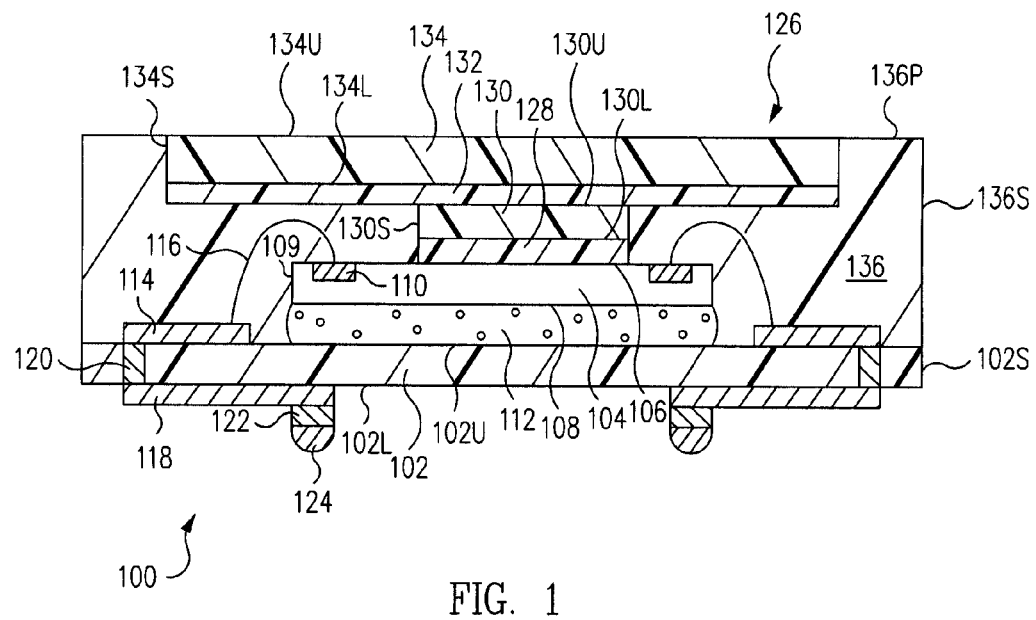
FIGS. 1, 2, 3, 4, 5, and 6 are cross-sectional views of heat spreader packages in accordance with various embodiments.

As an overview, referring to FIG. 1, a heat spreader package 100 includes a substrate 102 having an upper surface 102U, upper traces 114 on upper surface 102U of substrate 102, and an electronic component 104 having an inactive surface 108 mounted to upper surface 102U of substrate 102. Electronic component 104 further includes an active surface 106 having bond pads 110. Bond wires 116 electrically connect bond pads 110 to upper traces 114. An inverted pyramid heat spreader 126 includes a lower heatsink 130, a lower heatsink adhesive 128 directly connecting lower heatsink 130 to active surface 106 of electronic component 104 inward of bond pads 110, an upper heatsink 134 having an absence of active circuitry, and an upper heatsink adhesive 132 directly connecting a lower surface 134L of upper heatsink 134 to lower heatsink 130. Upper heatsink adhesive 132 is a dielectric directly between bond wires 116 and upper heatsink 134 that prevents inadvertent shorting between bond wires 116 and upper heatsink 134.

Now in more detail, FIG. 1 is a cross-sectional view of a heat spreader package 100 in accordance with one embodiment. Heat spreader package 100, sometimes called an electronic component package, includes a substrate 102. Substrate 102 is a dielectric material such as laminate, ceramic, printed circuit board material, or other dielectric material.

Substrate 102 includes an upper, e.g., first, surface 102U and an opposite lower, e.g., second, surface 102L. Substrate 102 further includes sides 102S extending perpendicularly between upper surface 102U and lower surface 102L. Although the terms parallel, perpendicular, and similar terms are used herein, it is to be understood that the described features may not be exactly parallel and perpendicular, but only substantially parallel and perpendicular to within accepted manufacturing tolerances.

Heat spreader package 100 further includes an electronic component 104, sometimes called a functional device. In one embodiment, electronic component 104 is an integrated circuit chip, e.g., an active component. However, in other embodiments, electronic component 104 is a passive component such as a capacitor, resistor, or inductor.

In accordance with this embodiment, electronic component 104 includes an active surface 106, an opposite inactive surface 108, and sides 109 extending perpendicularly between active surface 106 and inactive surface 108.

Electronic component 104 further includes bond pads 110 formed on active surface 106. Inactive surface 108 is mounted to upper surface 102U of substrate 102 with an adhesive 112.

Formed on upper surface 102U of substrate 102 are electrically conductive upper, e.g., first, traces 114, e.g., formed of copper. Bond pads 110 are electrically connected to upper traces 114, e.g., bond fingers thereof, by electrically conductive bond wires 116.

Formed on lower surface 102L of substrate 102 are lower, e.g., second, traces 118. Lower traces 118 are electrically connected to upper traces 114 by electrically conductive vias 120 extending through substrate 102 between upper surface 102U and lower surface 102L.

Although not illustrated in FIG. 1, in one embodiment, heat spreader package 100 further includes solder masks on upper and lower surface 102U, 102L that protect first portions of upper and lower traces 114, 118 while exposing second portions, e.g., terminals and/or bond fingers, of upper and lower traces 114, 118.

Formed on lower traces 118 are electrically conductive interconnection pads 122. Formed on interconnection pads 122 are electrically conductive interconnection balls 124, e.g., solder balls in a ball grid array (BGA). In another embodiment, interconnection balls 124 are not formed, e.g., to form a land grid array (LGA). Although BGA and LGA package configurations are set forth, in other embodiments, heat spreader package 100 is formed with other package configurations.

Although a particular electrically conductive pathway between bond pads 110 and interconnection balls 124 is described above, other electrically conductive pathways can be formed. For example, contact metallizations can be formed between the various electrical conductors.

Further, instead of straight though vias 120, in one embodiment, substrate 102 is a multilayer substrate and a plurality of vias and/or internal traces form the electrical interconnection between upper traces 114 and lower traces 118.

An inverted pyramid heat spreader 126 is stacked upon and thermally connected to electronic component 104. In accordance with this embodiment, inverted pyramid heat spreader 126 includes a lower, e.g., first, heatsink adhesive 128, a lower, e.g., first, heatsink 130, an upper, e.g., second, heatsink adhesive 132, and an upper, e.g., second, heatsink 134.

Lower heatsink 130 includes a lower, e.g., first, surface 130L, an upper, e.g., second, surface 130U and sides 130S extending perpendicularly between upper surface 130U and lower surface 130L.

Lower surface 130L of lower heatsink 130 is directly attached to active surface 106 of electronic component 104 by lower heatsink adhesive 128. Lower heatsink 130 has an area in a plane parallel to active surface 106, i.e., the area of lower surface 130L, less than the area of active surface 106 allowing lower heatsink 130 to be mounted to active surface 106 inwards of bond pads 110. Accordingly, lower heatsink 130 does not cover bond pads 110 thus avoiding contact between lower heatsink 130 and bond wires 116.

Upper heatsink 134 includes a lower, e.g., first, surface 134L, an upper, e.g., second, surface 134U and sides 134S extending perpendicularly between upper surface 134U and lower surface 134L. Lower surface 134L of upper heatsink 134 is directly attached to upper surface 130U of lower heatsink 130 by upper heatsink adhesive 132. As discussed in greater detail below, upper heatsink adhesive 132 entirely covers lower surface 134L of upper heatsink 134.

Upper heatsink 134 has an area in a plane parallel to active surface 106, i.e., the area of lower surface 134L, greater than the area of upper surface 130U (and thus lower surface 130L) of lower heatsink 130. Accordingly, sides 134S of upper heatsink 134 are laterally outwards of sides 130S of lower heatsink 130.

In accordance with this embodiment, upper heatsink 134 has an area in a plane parallel to active surface 106, i.e., the area of lower surface 134L, greater than the area of active surface 106.

Accordingly, upper heatsink 134 overhangs electronic component 104 and generally is located directly above active surface 106 including bond pads 110. Thus, sides 134S of upper heatsink 134 are laterally outwards of sides 109 of electronic component 104. Further, sides 134S of upper heatsink 134 are lateral inwards of sides 102S of substrate 102.

Heat spreader package 100 further includes a dielectric package body 136, e.g., formed of encapsulant or molding compound. Package body 136 encloses upper surface 102U of substrate 102, electronic component 104, bond wires 116, lower heatsink adhesive 128, lower heatsink 130, upper heatsink adhesive 132, and upper heatsink 134.

More particularly, package body 136 encloses and directly contacts sides 109 and the exposed portions of active surface 106 of electronic component 104 including bond pads 110 and bond wires 116 connected thereto. Further, package body 136 encloses and directly contacts sides 130S of lower heatsink 130. Further, package body 136 encloses and directly contacts the exposed portion of lower heatsink adhesive 132 and sides 134S of upper heatsink 134.

Package body 136 includes sides 136S and a principal surface 136P. Principal surface 136P is parallel to upper and lower surfaces 102U, 102L of substrate 102, active and inactive surfaces 106, 108 of electronic component 104, upper and lower surfaces 130U, 130L of lower heatsink 130, and upper and lower surfaces 134U, 134L of upper heatsink 134.

Further, principal surface 136P is coplanar, i.e., lies in a common plane, with upper surface 134U of upper heatsink 134. Accordingly, upper surface 134U of upper heatsink 134 is directly exposed to the ambient environment. Stated another way, upper surface 134U of upper heatsink 134 is not covered by package body 136. Principal surface 136P is in the shape of a rectangular annulus around upper surface 134U of upper heatsink 134.

Sides 136S of package body 136 are parallel to and coplanar with sides 102S of substrate in accordance with this embodiment. Illustratively, heat spreader package 100 is formed simultaneously with a plurality of heat spreader packages 100 in an array. The array is singulated, e.g., by sawing, resulting in sides 102S of substrate 102 being parallel to and coplanar with sides 136S of package body 136.

Lower heatsink 130 and upper heatsink 134 are formed of materials having a higher thermal conductivity than package body 136. More particularly, lower heatsink 130 is formed of a material having a relatively high thermal conductivity, e.g., is formed of silicon, a metal such as copper, a metal alloy, a metal oxide, ceramic, or other thermally conductive material.

In one particular embodiment, lower heatsink 130 is formed of silicon, sometimes called dummy silicon, having an absence of active circuitry. In this manner, the thermal coefficient of expansion (TCE) of lower heatsink 130 matches the thermal coefficient of expansion of electronic component 104. This minimizes stress imparted by lower heatsink 130 on electronic component 104 due to differential thermal expansion.

Similarly, upper heatsink 134 is formed of a material having a relatively high thermal conductivity, e.g., is formed of silicon, a metal such as copper, a metal alloy, a metal oxide, ceramic, or other thermally conductive material. In one particular embodiment, upper heatsink 134 is formed of silicon, sometimes called dummy silicon, having an absence of active circuitry. In this manner, the thermal coefficient of expansion (TCE) of upper heatsink 134 matches the thermal coefficient of expansion of electronic component 104 and lower heatsink 130 in the case where lower heatsink 130 is formed of silicon. This minimizes stress imparted by upper heatsink 134 on electronic component 104 and lower heatsink 130 due to differential thermal expansion.

Lower heatsink adhesive 128 and upper heatsink adhesive 132 are also formed of a material having a relatively high thermal conductivity, e.g., a thermal conductivity greater than package body 136. Illustratively, lower heatsink adhesive 128 and upper heatsink adhesive 132 are thermal interface material (TIM), and/or a thermal film. Lower heatsink adhesive 128 and upper heatsink adhesive 132 are dielectric, i.e., are non-electrically conductive.

As inverted pyramid heat spreader 126 has a relatively high thermal conductivity, heat is readily transferred from electronic component 104 through inverted pyramid heat spreader 126 to the ambient environment. More particularly, heat is transferred from electronic component 104 through lower heatsink adhesive 128, through lower heatsink 130, through upper heatsink adhesive 132, through upper heatsink 134 and to the ambient environment.

As discussed above, upper surface 134U of upper heatsink 134 is exposed directly to the ambient environment thus maximizing heat transfer from upper heatsink 134 to the ambient environment. By dissipating heat generated by electronic component 104 to the ambient environment, inverted pyramid heat spreader 126 prevents overheating of electronic component 104 and the associated damage.

Further, lower heatsink 130 spaces upper heatsink 134 above the loop height of bond wires 116. Upper heatsink adhesive 132 is located directly above bond pads 110/bond wires 116 and is directly between bond pads 110/bond wires 116 and upper heatsink 134.

Due to the extremely small spacing between bond wires 116 and upper heatsink adhesive 132, in certain instances, bond wires 116 contact upper heatsink adhesive 132, e.g., as a result of tolerances in manufacturing and/or wire sweep during formation of package body 136. However, upper heatsink adhesive 132 is a dielectric material. Upper heatsink adhesive 132 prevents direct contact between bond wires 116 and upper heatsink 134 while at the same time electrically isolates bond wires 116 from upper heatsink 134. In this manner, upper heatsink adhesive 132 prevents inadvertent contact and shorting of bond wires 116 with upper heatsink 134 and the associated failure of heat spreader package 100.

Although a particularly sized electronic component 104 is illustrated in FIG. 1, heat spreader package 100 can readily be formed with electronic components having larger or smaller sizes than electronic component 104. At the same time, the same overall dimensions of heat spreader package 100 including the same design for inverted pyramid heat spreader 126 is maintained.

More particularly, lower surface 130L of lower heatsink 130 is mounted to active surface 106 of electronic component 104 inward of bond pads 110 as set forth above. As long as lower surface 130L of lower heatsink 130 fits inward of the bond pads of the electronic component having a size different than electronic component 104, inverted pyramid heat spreader 126 can be used with the electronic component.

Accordingly, inverted pyramid heat spreader 126 can be used with various electronic component sizes while maintaining the same heat spreader package dimensions. By using the same design for inverted pyramid heat spreader 126, the tooling to form package body 136 around inverted pyramid heat spreader 126 is reduced compared to using a wide variety of different inverted pyramid heat spreader designs, each of which would require special tooling to form package body 136. Further, by using the same design for inverted pyramid heat spreader 126 with different sized electronic components, the external appearance of the resulting heat spreader packages is identical even though the heat spreader packages are formed with different sized electronic components.

To fabricate heat spreader package 100, in one embodiment, inactive surface 108 of electronic component 104 is mounted to upper surface 102U of substrate 102 with adhesive 112. Bond wires 116 are formed to electrically connect bond pads 110 to upper traces 114, e.g., bond fingers thereof.

Inverted pyramid heat spreader 126 is mounted to active surface 106 of electronic component 104. For example, lower heatsink 130 is mounted to active surface 106 by lower heatsink adhesive 128 either before or after formation of bond wires 116. Upper heatsink 134 is mounted to lower heatsink 130 by upper heatsink adhesive 132 after formation of bond wires 116. Upper heatsink adhesive 132 prevents inadvertent contact between bond wires 116 and upper heatsink 134 during mounting of upper heatsink 134.

In one embodiment, upper heatsink adhesive 132, e.g., a sheet of adhesive, is applied to upper heatsinks 134 while still in panel form, i.e., while a plurality of upper heatsinks 134 are still integrally connected together in a single piece. The panel is singulated to form individual upper heatsinks 134 each having an upper heatsink adhesive 132 attached thereto. In another embodiment, upper heatsink adhesive 132 is attached to upper heatsink 134 after singulation.

In another example, upper heatsink 134 is mounted to lower heatsink 130 by upper heatsink adhesive 132 prior to mounting of inverted pyramid heat spreader 126 to electronic component 104. Upper heatsink 134, upper heatsink adhesive 132, and lower heatsink 130 are simultaneously mounted to active surface 106 of electronic component 104 by lower heatsink adhesive 128 after formation of bond wires 116.

Package body 136 is formed to encapsulate upper surface 102U of substrate 102, electronic component 104, bond wires 116, lower heatsink adhesive 128, lower heatsink 130, upper heatsink adhesive 132 and upper heatsink 134. Illustratively, package body 136 is formed using a molding system in which heat spreader package 100 (absent package body 136) is placed into a mold. Mold compound is injected into the mold and then cured, e.g., cooled, to form package body 136. Heat spreader package 100 is removed from the mold. Any one of a number of different molding systems can be used to form package body 136 such as a film assisted molding system, a liquid compression molding system, or other molding system, and the particular molding system used is not essential to this embodiment.

Upper heatsink adhesive 132 prevents inadvertent contact between bond wires 116 and upper heatsink 134, e.g., due to wire sweep, during the formation of package body 136.

As set forth above, upper surface 134U of upper heatsink 134 is exposed from package body 136. As discussed in greater detail below with reference to FIG. 2, in another embodiment, the surface area of upper surface 134U of upper heatsink 134 is maximized to provide maximum heat transferred to the ambient environment.

Figure 2:
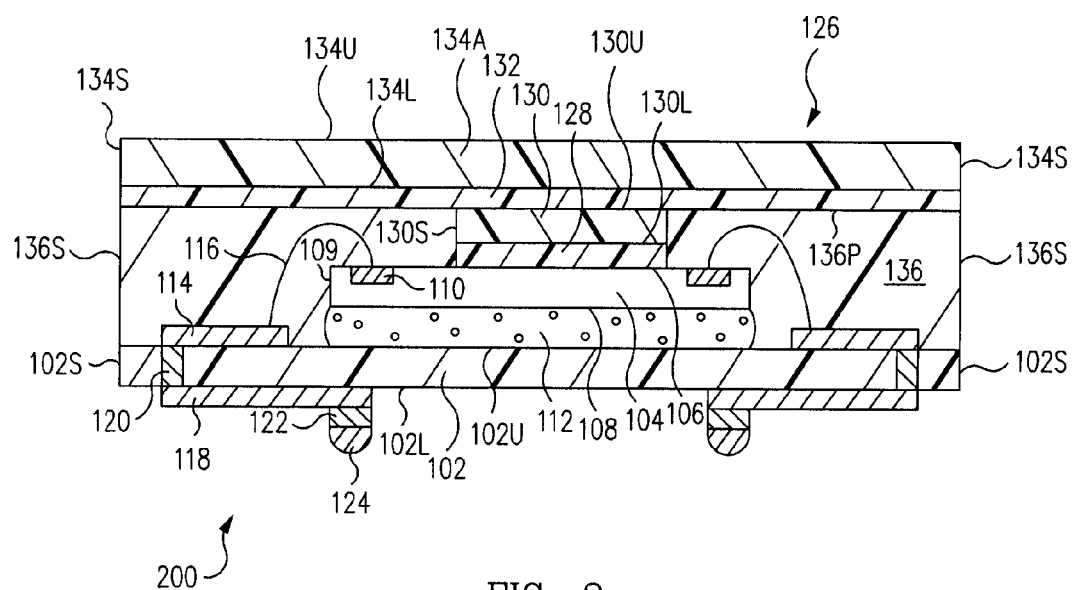

FIG. 2 is a cross-sectional view of a heat spreader package 200 in accordance with one embodiment. Heat spreader package 200 of FIG. 2 is substantially similar to heat spreader package 100 of FIG. 1 and only the significant differences between heat spreader package 200 and heat spreader package 100 are discussed below. More particularly, heat spreader package 200 of FIG. 2 is formed with an upper heatsink 134A that is similar to, but larger than, upper heatsink 134 of heat spreader package 100 of FIG. 1. Accordingly, the discussion above regarding upper heatsink 134 is applicable to upper heatsink 134A and so is not repeated here.

Referring now to FIG. 2, in accordance with this embodiment, upper heatsink 134A is the same size as substrate 102. More particularly, sides 134S of upper heatsink 134A are parallel to and coplanar with sides 102S of substrate 102 and also with sides 136S of package body 136. Accordingly, the entire upper surface of heat spreader package 200 is upper surface 134U of upper heatsink 134. Principal surface 136P of package body 136 directly contacts and encloses the exposed portion of upper heatsink adhesive 132.

By maximizing the exposed surface area of upper heatsink 134A, maximum heat transferred from electronic component 104 to the ambient environment is achieved.

Figure 3:
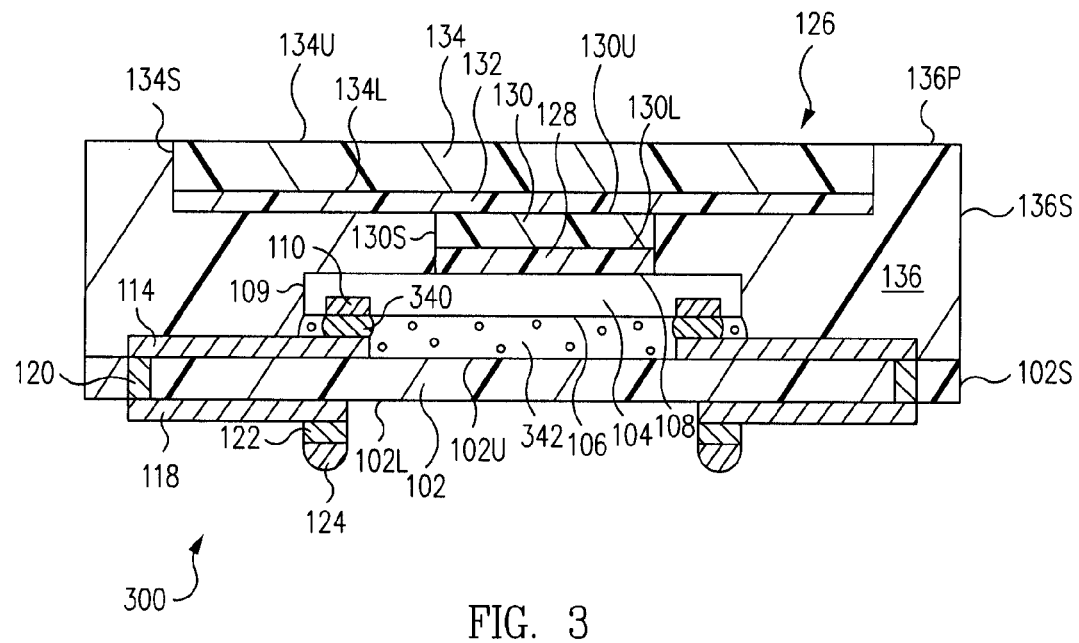

FIG. 3 is a cross-sectional view of a heat spreader package 300 in accordance with one embodiment. Heat spreader package 300 of FIG. 3 is substantially similar to heat spreader package 100 of FIG. 1 and only the significant differences between heat spreader package 300 and heat spreader package 100 are discussed below. More particularly, heat spreader package 300 of FIG. 3 is formed with electronic component 104 mounted in a flip chip configuration, whereas electronic component 104 is mounted in a wirebond configuration in heat spreader package 100 of FIG. 1.

Referring now to FIG. 3, in accordance with this embodiment, bond pads 110 of electronic component 104 are physically and electrically connected to upper traces 114, e.g., terminals thereof, by electrically conductive flip chip bumps 340, e.g., solder bumps.

Optionally, an underfill 342 is applied between upper surface 102U of substrate 102 and active surface 106 of electronic component 104. Underfill 342 encloses flip chip bumps 340. Underfill 342 is optional, and in one embodiment, is not formed.

In accordance with this embodiment, lower surface 130L of lower heatsink 130 is directly attached to inactive surface 108 of electronic component 104 by lower heatsink adhesive 128. Lower heatsink 130 has an area in a plane parallel to inactive surface 108, i.e., the area of lower surface 130L, less than the area of inactive surface 108. However, as discussed in greater detail below with reference to FIG. 5, in another embodiment, lower surface 130L of lower heatsink 130 is the same size as, or larger than, inactive surface 108 of electronic component 104.

To fabricate heat spreader package 300, in one embodiment, bond pads 110 are physically and electrically connected to upper traces 114, e.g., terminals thereof, by flip chip bumps 340. Optionally, underfill 342 is formed, e.g., using a capillary underfill technique.

Inverted pyramid heat spreader 126 is mounted to inactive surface 108 of electronic component 104. For example, lower heatsink 130 is mounted to inactive surface 108 by lower heatsink adhesive 128. Upper heatsink 134 is mounted to lower heatsink 130 by upper heatsink adhesive 132.

In another example, upper heatsink 134 is mounted to lower heatsink 130 by upper heatsink adhesive 132 prior to mounting of inverted pyramid heat spreader 126 to electronic component 104. Upper heatsink 134, upper heatsink adhesive 132, and lower heatsink 130 are simultaneously mounted to inactive surface 108 of electronic component 104 by lower heatsink adhesive 128.

Package body 136 is formed to encapsulate upper surface 102U of substrate 102, electronic component 104, lower heatsink adhesive 128, lower heatsink 130, upper heatsink adhesive 132, upper heatsink 134 and underfill 342 in a manner similar to that discussed above regarding heat spreader package 100 of FIG. 1. In the case where underfill 342 is not formed, package body 136 also fills the space between upper surface 102U of substrate 102 and active surface 106 of electronic component 104 and encloses flip chip bumps 340.

Figure 4:
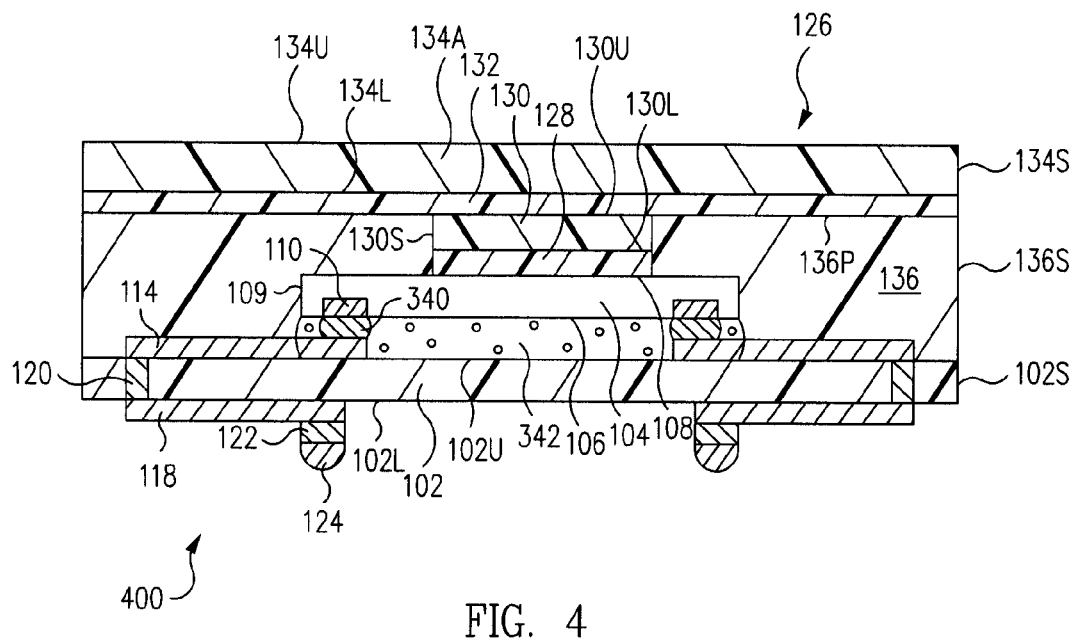

FIG. 4 is a cross-sectional view of a heat spreader package 400 in accordance with one embodiment. Heat spreader package 400 of FIG. 4 is substantially similar to heat spreader package 300 of FIG. 3 and only the significant differences between heat spreader package 400 and heat spreader package 300 are discussed below. More particularly, heat spreader package 400 of FIG. 4 is formed with upper heatsink 134A as discussed above in reference to heat spreader package 200 of FIG. 2.

Figure 5:
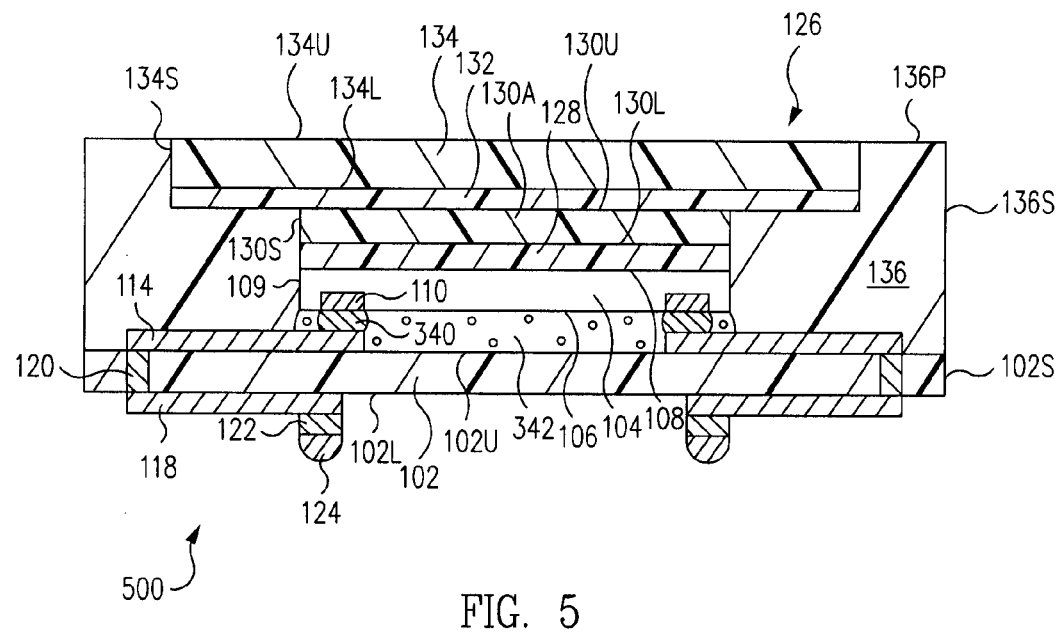

FIG. 5 is a cross-sectional view of a heat spreader package 500 in accordance with one embodiment. Heat spreader package 500 of FIG. 5 is substantially similar to heat spreader package 300 of FIG. 3 and only the significant differences between heat spreader package 500 and heat spreader package 300 are discussed below. More particularly, heat spreader package 500 of FIG. 5 is formed with a lower heatsink 130A that is similar to, but larger than, lower heatsink 130 of heat spreader package 300 of FIG. 3. Accordingly, the discussion above regarding lower heatsink 130 is applicable to lower heatsink 130A and so is not repeated here.

Referring now to FIG. 5, in accordance with this embodiment, lower heatsink 130A is the same size as electronic component 104, although is greater in size in another embodiment. More particularly, sides 130S of lower heatsink 130A are parallel to and coplanar with sides 109 of electronic component 104. Accordingly, the entire lower surface 130L of lower heatsink 130A is thermally connected to the entire inactive surface 108 of electronic component 104.

By maximizing the contact surface area between lower heatsink 130A and electronic component 104, maximum heat transfer from electronic component 104 to lower heatsink 130A and ultimately to the ambient environment is achieved.

Figure 6:
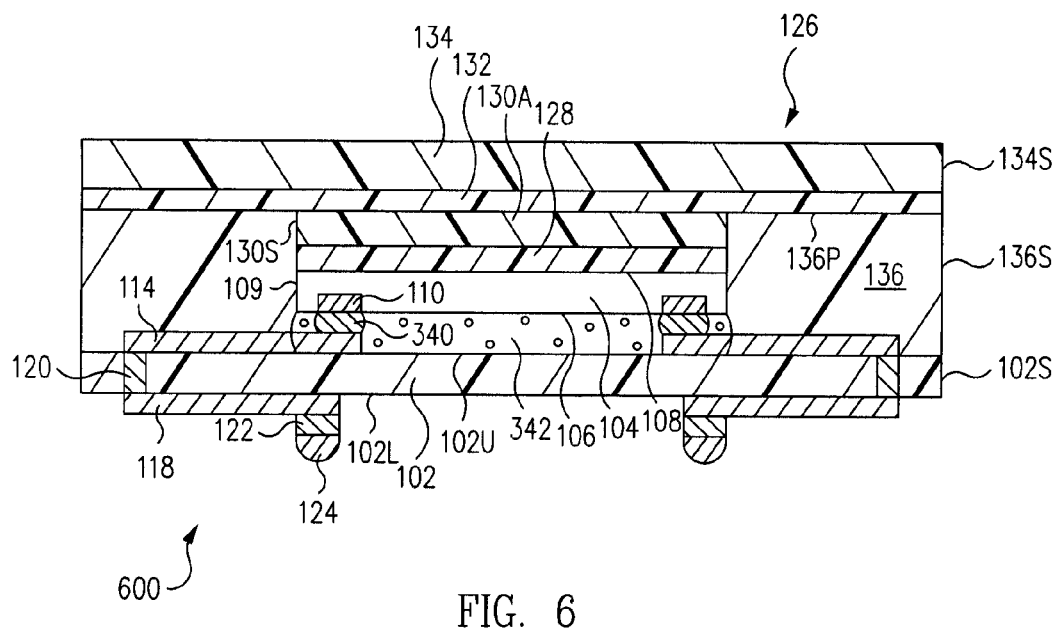

FIG. 6 is a cross-sectional view of a heat spreader package 600 in accordance with one embodiment. Heat spreader package 600 of FIG. 6 is substantially similar to heat spreader package 400 of FIG. 4 and only the significant differences between heat spreader package 600 and heat spreader package 400 are discussed below. More particularly, heat spreader package 600 of FIG. 6 is formed with lower heatsink 130A as discussed above in reference to heat spreader package 500 of FIG. 5.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A heat spreader package comprising:
    a substrate comprising a first surface;
    first traces on the first surface of the substrate;
    an electronic component comprising an inactive surface mounted to the first surface of the substrate, the electronic component further comprising an active surface comprising bond pads;
    bond wires electrically connecting the bond pads to the first traces; and
    an inverted pyramid heat spreader comprising:
        a first heatsink;
        a first heatsink adhesive directly connecting the first heatsink to the active surface of the electronic component inward of the bond pads;
        a second heatsink having an absence of active circuitry; and
        a second heatsink adhesive directly connecting a first surface of the second heatsink to the first heatsink, the bond wires directly contacting the second heatsink adhesive, the second heatsink adhesive being a dielectric directly between the bond wires and the second heatsink to prevent shorting between the bond wires and the second heatsink.

2. The heat spreader package of claim 1 wherein the substrate comprises sides, wherein the second heatsink further comprises sides, the sides of the second heatsink being parallel to and co-planar with the sides of the substrate.

3. The heat spreader package of claim 2 further comprising a package body, the package body comprising a principal surface directly contacting the second heatsink adhesive.

4. The heat spreader package of claim 1 further comprising:
    a package body, the package body comprising a principal surface parallel to and coplanar with a second surface the second heatsink.

5. A heat spreader package comprising
    an electronic component;
    an inverted pyramid heat spreader thermally connected to the electronic component, the inverted pyramid heat spreader comprising:
        a first heatsink;
        a first heatsink adhesive directly connecting the first heatsink to the electronic component;
        a second heatsink having an absence of active circuitry; and a second heatsink adhesive directly connecting a first surface of the second heatsink to the first heatsink, the second heatsink adhesive entirely covering the first surface the second heatsink; and a package body, the package body comprising a principal surface parallel to and coplanar with a second surface the second heatsink.

6. The heat spreader package of claim 5 wherein the first heatsink includes a first surface, a second surface, and sides extending between the first surface and the second surface the first heatsink, the first surface of the first heatsink being directly attached to the electronic component by the first heatsink adhesive.

7. The heat spreader package of claim 6 wherein the first surface of the first heatsink has an area less than an area of an active surface of the electronic component.

8. The heat spreader package of claim 7 wherein the active surface comprises bond pads, the first heatsink being mounted to the active surface inward of the bond pads.

9. The heat spreader package of claim 8 wherein the sides of the first heatsink are inward of sides of the electronic component.

10. The heat spreader package of claim 8 wherein the first surface of the second heatsink has an area greater than the active surface.

11. The heat spreader package of claim 10 wherein the second heatsink is located directly above the bond pads.

12. The heat spreader package of claim 10 wherein the second heatsink adhesive is directly between the bond pads and the second heatsink.

13. The heat spreader package of claim 10 further comprising:

a substrate comprising a first surface, wherein an inactive surface of the electronic component is mounted to the first surface of the substrate;

first traces on the first surface of the substrate; and bond wires electrically connecting the bond pads to the first traces, the second heatsink adhesive being directly between the bond wires and the second heatsink.

14. The heat spreader package of claim 13 wherein the second heatsink adhesive prevents shorting between the bond wires and the second heatsink.

15. The heat spreader package of claim 5 further comprising:

a substrate comprising sides, wherein the second heatsink further comprises sides, the sides of the second heatsink being inwards of the sides of the substrate.

16. The heat spreader package of claim 5 further comprising:

a substrate comprising first traces; and flip chip bumps physically and electrically connecting bond pads on an active surface of the electronic component to the first traces, wherein the first heatsink is directly attached to an inactive surface of the electronic component by the first heatsink adhesive.

17. The heat spreader package of claim 16 wherein the first surface of the first heatsink has an area less than an area of the inactive surface of the electronic component.

18. The heat spreader package of claim 16 wherein the first surface of the first heatsink has an area equal to or greater than an area of the inactive surface of the electronic component.

19. The heat spreader package of claim 5 further comprising:

a substrate comprising traces, wherein an inactive surface the electronic component is coupled to the substrate; and bond wires coupling bond pads on an active surface of the electronic component to the traces, the bond wires directly contacting the second heatsink adhesive.

20. A heat spreader package comprising:

an electronic component;

an inverted pyramid heat spreader comprising:

a first dummy silicon heatsink;

a first heatsink adhesive directly connecting the first dummy silicon heatsink to the electronic component;

a second dummy silicon heatsink; and a second heatsink adhesive directly connecting a first surface the second dummy silicon heatsink to the first dummy silicon heatsink, the second heatsink adhesive entirely covering the first surface the second dummy silicon heatsink;

a package body enclosing at least a portion of the electronic component, wherein the first dummy silicon heatsink and the second dummy silicon heatsink having a higher thermal conductivity than the package body;

a substrate comprising traces, wherein an inactive surface of the electronic component is coupled to the substrate; and bond wires coupling bond pads on an active surface of the electronic component to the traces, the bond wires directly contacting the second heatsink adhesive, wherein the second heatsink adhesive prevents shorting of the bond wires to the second dummy silicon heatsink.

* * * * *

UNITED STATES PATENT AND TRADEMARK OFFICE
CERTIFICATE OF CORRECTION

PATENT NO. : 7,999,371 B1  
APPLICATION NO. : 12/702505  
DATED : August 16, 2011  
INVENTOR(S) : Adrian Arcedera and Sasanka Laxmi Narasimha Kanuparthi Page 1 of 1

It is certified that error appears in the above-identified patent and that said Letters Patent is hereby corrected as shown below:

In Column 8, Line 56, Claim 4, between "surface" and "the second", insert --of--;
In Column 8, Line 58, Claim 5, after "comprising", insert --:--;
In Column 9, Line 4, Claim 5, between "surface" and "the second", insert --of--;
In Column 9, Line 6, Claim 5, between "surface" and "the second", insert --of--;
In Column 9, Line 10, Claim 6, between "surface" and "the first", insert --of--;
In Column 10, Line 18, Claim 19, before "the electronic", insert --of--;
In Column 10, Line 30, Claim 20, between "surface" and "the second", insert --of--;
In Column 10, Line 32, Claim 20, between "surface" and "the second", insert --of--.

Signed and Sealed this
Seventeenth Day of July, 2012

David J. Kappos
*Director of the United States Patent and Trademark Office*